(12) United States Patent
Lee et al.

(10) Patent No.: US 11,073,537 B2
(45) Date of Patent: Jul. 27, 2021

(54) PROBE CARD DEVICE

(71) Applicant: CHUNGHWA PRECISION TEST TECH. CO., LTD., Taoyuan (TW)

(72) Inventors: Wen-Tsung Lee, New Taipei (TW); Kai-Chieh Hsieh, Taoyuan (TW); Chao-Hui Tseng, New Taipei (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 43 days.

(21) Appl. No.: 16/732,349

(22) Filed: Jan. 2, 2020

(65) Prior Publication Data
US 2020/0300893 A1 Sep. 24, 2020

(30) Foreign Application Priority Data
Mar. 18, 2019 (TW) .................................. 108109105

(51) Int. Cl.
*G01R 1/067* (2006.01)
*G01R 1/073* (2006.01)

(52) U.S. Cl.
CPC ..... *G01R 1/06761* (2013.01); *G01R 1/07342* (2013.01); *G01R 1/07378* (2013.01)

(58) Field of Classification Search
CPC ............ G01R 1/06761; G01R 1/06755; G01R 1/06711; G01R 1/06772; G01R 1/073;
(Continued)

(56) References Cited

U.S. PATENT DOCUMENTS

| 5,525,911 A | * | 6/1996 | Marumo | G01R 1/06711 324/754.07 |
| 5,532,613 A | * | 7/1996 | Nagasawa | G01R 1/06711 137/312 |

(Continued)

FOREIGN PATENT DOCUMENTS

| CN | 106018891 B | * | 1/2019 | |
| JP | 2014112046 A | * | 6/2014 | ......... G01R 1/07357 |

OTHER PUBLICATIONS

English machine translation of Peng et al. CN 106018891 (Peng) (Year: 2019).*

(Continued)

*Primary Examiner* — Lee E Rodak
(74) *Attorney, Agent, or Firm* — Li & Cai Intellectual Property Office (57) ABSTRACT

The present disclosure provides a probe card device and a conductive probe thereof. The conductive probe includes a metallic pin, an outer electrode, and a dielectric layer. The metallic pin includes a middle segment, a first connecting segment and a second connecting segment respectively extending from two opposite ends of the middle segment, and a first contacting segment and a second contacting segment respectively extending from the first connecting segment and second contacting segment along two opposite directions away from the middle segment. At least part of the outer electrode corresponds in position to the middle segment and is arranged adjacent to the first connecting segment. The dielectric layer is sandwiched between and entirely separates the metallic pin and the outer electrode, so that the outer electrode, the dielectric layer, and the metallic pin are jointly configured to generate a capacitance effect.

7 Claims, 8 Drawing Sheets

(58) Field of Classification Search
CPC ............ G01R 1/07307; G01R 1/07314; G01R 1/07357; G01R 1/07342; G01R 1/07378; G01R 1/07371
See application file for complete search history.

(56) References Cited

U.S. PATENT DOCUMENTS

| | | | |
|---|---|---|---|
| 6,452,406 B1* | 9/2002 | Beaman | G01R 1/0675 324/755.01 |
| 2004/0100295 A1* | 5/2004 | Lee | G01R 1/06772 324/755.02 |
| 2018/0299486 A1* | 10/2018 | Eldridge | G01R 1/06733 |

OTHER PUBLICATIONS

English machine translation of Ito et al. JP 2014112046 (Ito). (Year: 2014).*

* cited by examiner

PROBE CARD DEVICE

CROSS-REFERENCE TO RELATED PATENT APPLICATION

This application claims the benefit of priority to Taiwan Patent Application No. 108109105, filed on Mar. 18, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a probe card device and a conductive probe thereof.

BACKGROUND OF THE DISCLOSURE

In a testing process of semi-conductor wafer, a testing apparatus is electrically connected to a device under test (DUT) by using a probe card device, and the testing apparatus can obtain a testing result of the DUT by signal transmission and signal analysis. A conventional probe card device has a plurality of probes arranged corresponding in position to electrical pads of objects to be tested, and the probes are used to simultaneously and respectively contact the electrical pads of the objects to be tested.

However, when the conventional probe card device is under a test related to transmission of high speed signals, the conventional probe card device tends to result in a power delivery network (PDN) having a larger impedance. Existing improvement methods mainly focus on how to design or adjust a space transformer, but the change of the space transformer tends to bring about other issues (e.g., a signal distortion).

SUMMARY OF THE DISCLOSURE

In response to the above-referenced technical inadequacies, the present disclosure provides a probe card device and a conductive probe thereof to effectively improve the issues associated with conventional probe card devices.

In one aspect, the present disclosure provides a probe card device, which includes a grounding sheet, a lower die, and a plurality of conductive probes. The grounding sheet has a plurality of grounding holes. The lower die has a plurality of lower thru-holes respectively corresponding in position to the grounding holes. The lower die is substantially parallel to the grounding sheet. The conductive probes respectively pass through the grounding holes of the grounding sheet and respectively pass through the lower thru-holes of the lower die. Each of the conductive probes includes a metallic pin, an outer electrode, and a dielectric layer that is sandwiched between the metallic pin and the outer electrode. In each of the conductive probes, the metallic pin and the outer electrode are entirely separated from each other through the dielectric layer, so that the outer electrode, a part of the dielectric layer connected to the outer electrode, and a part of the metallic pin connected to the part of the dielectric layer are jointly configured to generate a capacitance effect. Each of the conductive probes includes a middle segment, a first connecting segment, a second connecting segment, a first contacting segment, and a second contacting segment. In each of the conductive probes, a part of the middle segment is arranged in the corresponding grounding hole and is entirely covered by the dielectric layer, the first connecting segment extends from an end of the middle segment, the second connecting segment extends from the other end of the middle segment and is arranged in the corresponding lower thru-hole, the first contacting segment extends from the first connecting segment, and the second contacting segment extends from the second connecting segment and is arranged outside of the corresponding lower thru-hole. In each of the conductive probes, at least part of the outer electrode abuts against the grounding sheet and corresponds in position to the middle segment, and the outer electrodes of the conductive probes are electrically connected to each other through the grounding sheet.

In one aspect, the present disclosure provides a conductive probe of a probe card device, which includes a metallic pin, an outer electrode, and a dielectric layer. The metallic pin includes a middle segment, a first connecting segment and a second connecting segment both extending from two opposite ends of the middle segment, respectively, a first contacting segment extending from the first connecting segment along a direction away from the middle segment, and a second contacting segment extending from the second connecting segment along a direction away from the middle segment. At least part of the outer electrode corresponds in position to the middle segment and is arranged adjacent to the first connecting segment. The dielectric layer is sandwiched between the metallic pin and the outer electrode. The metallic pin and the outer electrode are entirely separated from each other through the dielectric layer, so that the outer electrode, a part of the dielectric layer connected to the outer electrode, and a part of the metallic pin connected to the part of the dielectric layer are jointly configured to generate a capacitance effect.

Therefore, a signal transmission path with a capacitance effect of the conductive probe in the present disclosure is provided, so that when the conductive probe is used to test a high speed signal of the DUT, the conductive probe can be immediately coupled to a capacitor after receiving the high speed signal. Accordingly, an integrity of the high speed signal transmission of the conductive probe can be effectively maintained, and the power impedance at resonant frequency can be reduced for improving the performance of PDN.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
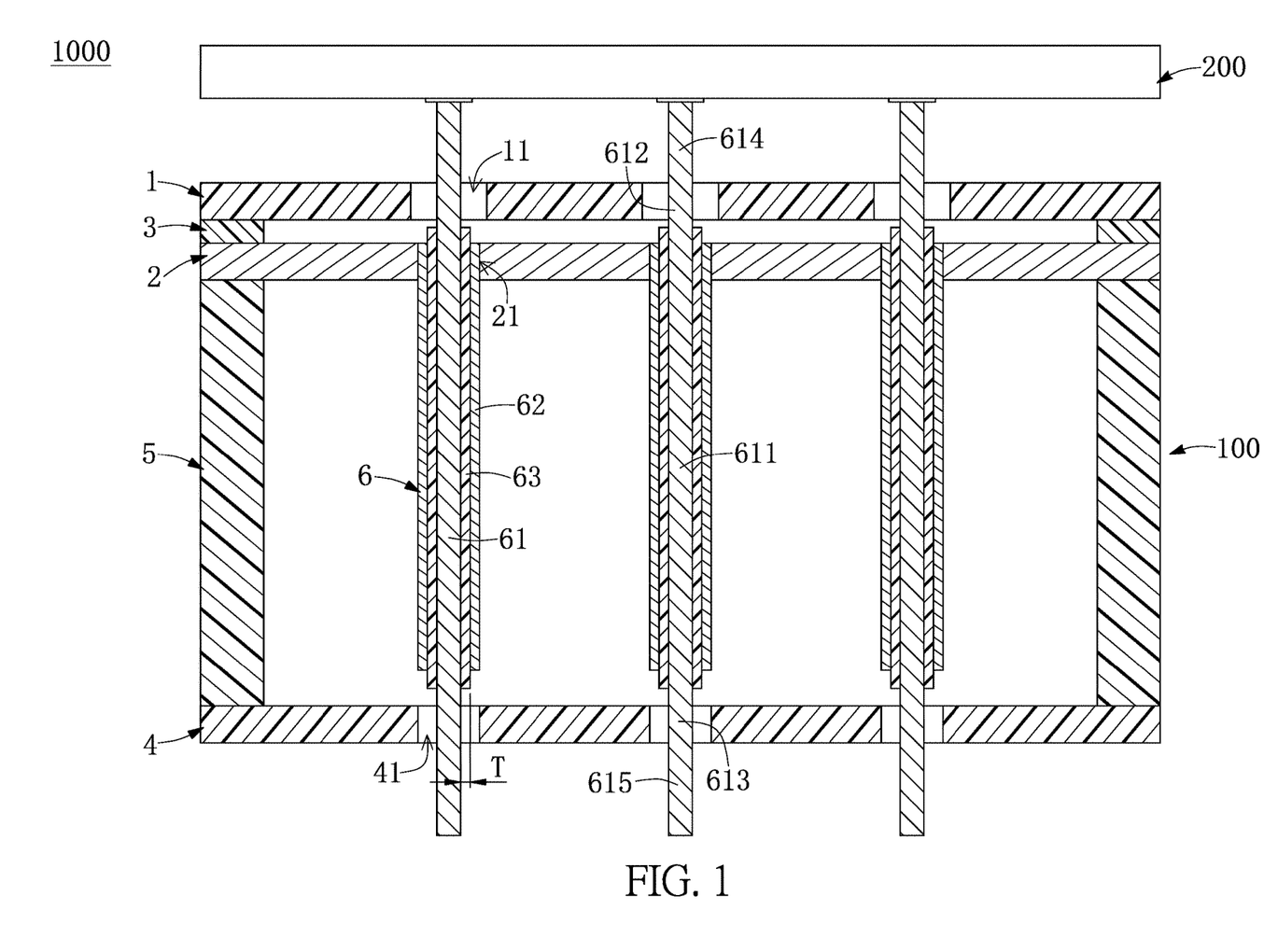
FIG. 1 is a cross-sectional view of a probe card device according to the present disclosure.

Referring to FIG. 1 to FIG. 9, an embodiment of the present disclosure provides a probe card device 1000. As shown in FIG. 1, the probe card device 1000 of the present embodiment includes a probe head 100 and a space transformer 200 abutted against one side of the probe head 100 (i.e., the top side of the probe head 1 as shown in FIG. 1), and the other side of the probe head 100 (i.e., the bottom side of the probe head 1 as shown in FIG. 1) can be used for testing a device under test (DUT), such as a semi-conductor wafer (not shown).

In order to easily describe the present embodiment, the figures only show a part of the probe card device 1000 for clearly showing the structure and connection of each component of the probe card device 1000. The following description discloses the structure and connection of each component of the probe head 100.

As shown in FIG. 1, the probe head 100 in the present embodiment includes an upper die 1, a grounding sheet 2, a spacing pad 3 sandwiched between the upper die 1 and the grounding sheet 2, a lower die 4, a spacer 5 sandwiched between the grounding sheet 2 and the lower die 4, and a plurality of conductive probes 6. However, in other embodiments of the present disclosure, the upper die 1, the spacing pad 3, and the spacer 5 of the probe head 100 can be omitted or can be replaced by other components. Moreover, the conductive probe 6 can be independently used (e.g., sold) or can be in cooperation with other components.

The upper die 1 and the grounding sheet 2 are spaced apart from each other. The grounding sheet 2 in the present embodiment is spaced apart from and parallel to the upper die 1 through the spacing pad 3, but the present disclosure is not limited thereto. The upper die 1 is arranged at one side of the grounding sheet 2 (i.e., the top side of the grounding sheet 2) away from the lower die 4. Specifically, the upper die 1 has a plurality of upper thru-holes 11, the grounding sheet 2 has a plurality of grounding holes 21, and the upper thru-holes 11 respectively correspond in position to the grounding holes 21.

It should be noted that the grounding sheet 2 in the present embodiment is a metallic sheet, but the present disclosure is not limited thereto. For example, in other embodiments of the present disclosure, the grounding sheet 2 can include an insulating board and a metallic layer that covers an outer surface of the insulating board, or can be a flexible circuit board mainly made of polyimide (PI).

Moreover, the lower die 4 and the grounding sheet 2 are spaced apart from each other and are parallel to each other. The grounding sheet 2 in the present embodiment is spaced apart from and parallel to the lower die 4 through the spacer 5, but the present disclosure is not limited thereto. The lower die 4 has a plurality of lower thru-holes 41 respectively corresponding in position to the grounding holes 21. In other words, the lower thru-holes 41 respectively correspond in position to the upper thru-holes 11.

It should be noted that the upper die 1, the grounding sheet 2, and the lower die 4 in the present embodiment are not in a staggered arrangement, so that each of the conductive probes 6 is in a straight line, but the present disclosure is not limited thereto. Moreover, the spacing pad 3 in the present embodiment can be an annular structure sandwiched between periphery portions of the upper die 1 and the grounding sheet 2, and the spacer 5 can also be an annular structure sandwiched between periphery portions of the grounding sheet 2 and the lower die 4. The present embodiment does not disclose the detailed structure of the spacing pad 3 and the spacer 5.

Figure 2:
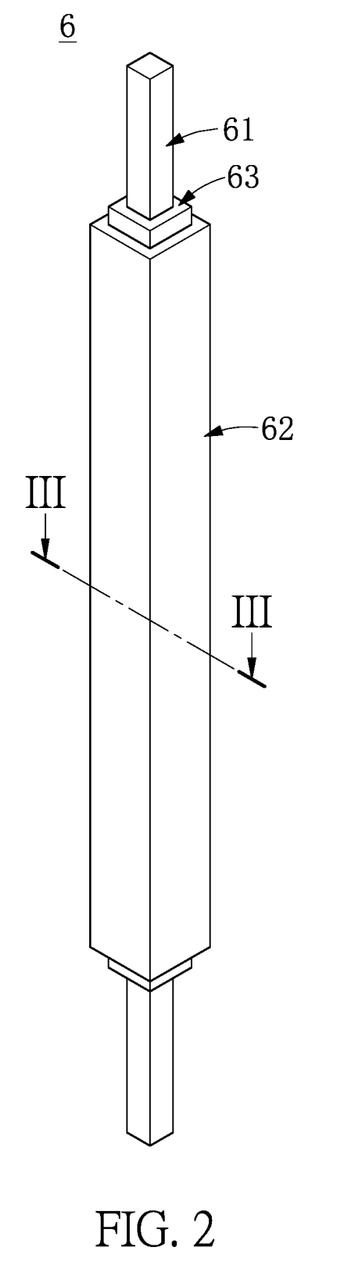
FIG. 2 is a perspective view showing a rectangular conductive probe according to the present disclosure.
Figure 3:
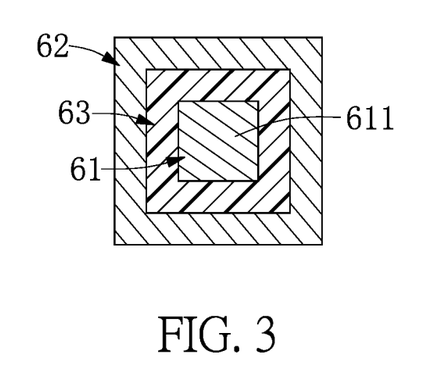
FIG. 3 is a cross-sectional view taken along a cross-section line III-III of FIG. 2.
Figure 4:
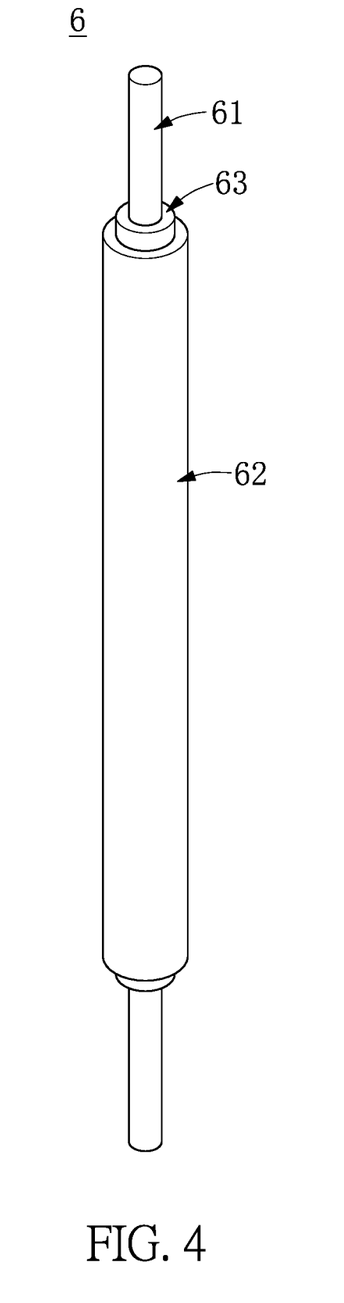
FIG. 4 is a perspective view showing a round conductive probe according to the present disclosure.

As shown in FIG. 1 to FIG. 3, the conductive probes 6 are substantially in a matrix arrangement. The conductive probes 6 respectively pass through the upper thru-holes 11 of the upper die 1, respectively pass through the grounding holes 21 of the grounding sheet 2, and respectively pass through the lower thru-holes 41 of the lower die 4. Each of the conductive probes 6 sequentially passes through the corresponding upper thru-hole 11 of the upper die 1, the corresponding grounding hole 21 of the grounding sheet 2, and the corresponding lower thru-hole 41 of the lower die 4.

Moreover, the conductive probe 6 in the present embodiment is a rectangular conductive probe, but the present disclosure is not limited thereto. For example, the conductive probe 6 can be a round conductive probe (shown in FIG. 4) or can be in other shapes.

As shown in FIG. 1 to FIG. 3, as the conductive probes 6 are of the same structure, the following description only discloses the structure of one of the conductive probes 6 for the sake of brevity. However, in other embodiments of the present disclosure, the conductive probes 6 of the probe head 100 can be formed in different structures.

The conductive probe 6 in the present embodiment is conductive and has a flexible straight structure. The conductive probe 6 has a cross section perpendicular to a longitudinal direction thereof, and the cross section is substantially a rectangle including a square. The conductive probe 6 includes a metallic pin 61, an outer electrode 62, and a dielectric layer 63 that is sandwiched between the metallic pin 61 and the outer electrode 62. The metallic pin 61 and the outer electrode 62 are made of a conductive material, and the dielectric layer 62 is made of an insulating material. The metallic pin 61 and the outer electrode 62 are entirely separated from each other through the dielectric layer 63, so that the outer electrode 62, a part of the dielectric layer 63 connected to the outer electrode 62, and a part of the metallic pin 61 connected to the part of the dielectric layer 63 are jointly configured to generate a capacitance effect, and can be regarded as a capacitor.

In summary, a signal transmission path with the capacitance effect of the conductive probe 6 in the present embodiment is provided, so that when the conductive probe 6 is used to test a high speed signal of the DUT, the conductive probe 6 can be immediately coupled to a capacitor after receiving the high speed signal. Accordingly, an integrity of the high speed signal transmission of the conductive probe 6 can be effectively maintained, and the power impedance at resonant frequency can be reduced for improving a performance of PDN.

As shown in FIG. 1 to FIG. 3, the metallic pin 61 includes a middle segment 611, a first connecting segment 612 and a second connecting segment 613 both extending from two opposite ends of the middle segment 611, respectively, a first contacting segment 614 extending from the first connecting segment 612 along a direction away from the middle segment 611, and a second contacting segment 615 extending from the second connecting segment 613 along a direction away from the middle segment 611.

In other words, along a direction from the space transformer 200 to DUT (e.g., a direction from an upper side toward a lower side shown in FIG. 1), the metallic pin 61 sequentially includes the first contacting segment 614, the first connecting segment 612, the middle segment 611, the second connecting segment 613, and the second contacting segment 615. The first contacting segment 614 is arranged outside of the corresponding upper thru-hole 11 of the upper die 1, and abuts against a corresponding conductive pad of the space transformer 200 (i.e., the space transformer 200 is fixed onto the first contacting segment 614 of the conductive probe 6). The first connecting segment 612 is arranged in the corresponding upper thru-hole 11 of the upper die 1. The middle segment 611 is arranged between the upper die 1 and the lower die 4, and a part of the middle segment 611 is arranged in the corresponding grounding hole 21 of the grounding sheet 2. The second connecting segment 613 is arranged in the corresponding lower thru-hole 41 of the lower die 4. The second contacting segment 615 is arranged outside of the corresponding lower thru-hole 41 of the lower die 4, and abuts against a corresponding conductive pad of the DUT (not shown).

Moreover, the first contacting segment 614, the first connecting segment 612, the middle segment 611, the second connecting segment 613, and the second contacting segment 615 of the conductive probe 6 in the present embodiment have the same outer diameter, but the present disclosure is not limited thereto. For example, in other embodiments of the present disclosure, a maximum outer diameter of the first contacting segment 614 can be larger than the other segment of the conductive probe 6, and can be larger than an aperture of the corresponding upper thru-hole 11, thereby preventing the first contacting segment 614 from dropping into the upper thru-hole 11; or each of the first contacting segment 614 and the second contacting segment 615 can be a sharp structure.

The position and structure of the outer electrode 62 and the dielectric layer 63 with respect to the metallic pin 61 can be adjusted or changed according to design requirements, but preferably satisfy the following limitations. The part of the middle segment 611 in the corresponding grounding hole 21 is entirely covered by the dielectric layer 63, and at least part of the outer electrode 62 abuts against the grounding sheet 2 and corresponds in position to the middle segment 611, so that the outer electrodes 62 of the conductive probes 6 are electrically connected to each other through the grounding sheet 2.

It should be noted that each of the dielectric layer 63 and the outer electrode 62 are preferably not formed on the first contacting segment 614 and the second contacting segment 615, but the present disclosure is not limited thereto.

Since the position and structure of the outer electrode 62 and the dielectric layer 63 with respect to the metallic pin 61 can be adjusted or changed according to design requirements, the present embodiment cannot disclose all varieties of the conductive probe 6. Accordingly, the following description only describes some varieties of the conductive probe 6.

Figure 5:
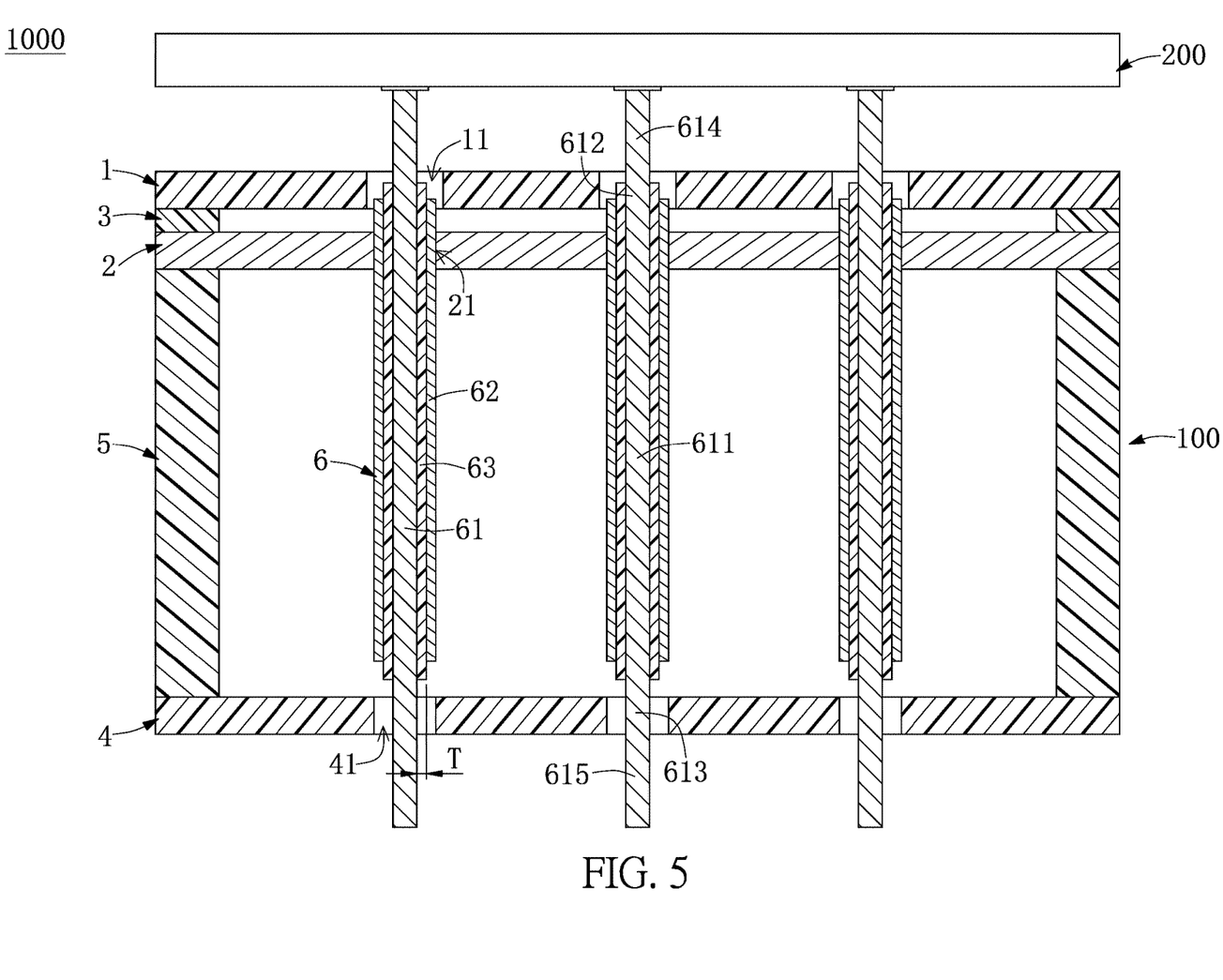
FIG. 5 is a cross-sectional view showing the probe card device when a first connecting segment of each of the conductive probes is covered by a dielectric layer.

As shown in FIG. 1 to FIG. 3, the dielectric layer 63 surroundingly covers at least 80% of an outer surface of the middle segment 611 of the metallic pin 61 and has a thickness T within a range of 0.1 μm to 8 μm. The thickness T of the dielectric layer 63 is preferably within a range of 5 μm to 8 μm. In addition, as shown in FIG. 5, the dielectric layer 63 can cover the entirety of the outer surface of the middle segment 611, and can further cover the first connecting segment 612 and/or the second connecting segment 613.

It should be noted that the dielectric layer 63 of the conductive probe 6 in the present embodiment is not only used as an insulating film for insulation between the adjacent conductive probe 6, but also used as a part of the capacitor. In other words, an insulating layer only used for insulation between any two adjacent probes is different from the dielectric layer 63 of the present embodiment. Specifically, the term "surroundingly cover" in the above description can be indicated as follows: in a cross section of the conductive probe 6 having the dielectric layer 63, the dielectric layer 63 covers the outer surface of the middle segment 611 entirely, but the present disclosure is not limited thereto.

Figure 6:
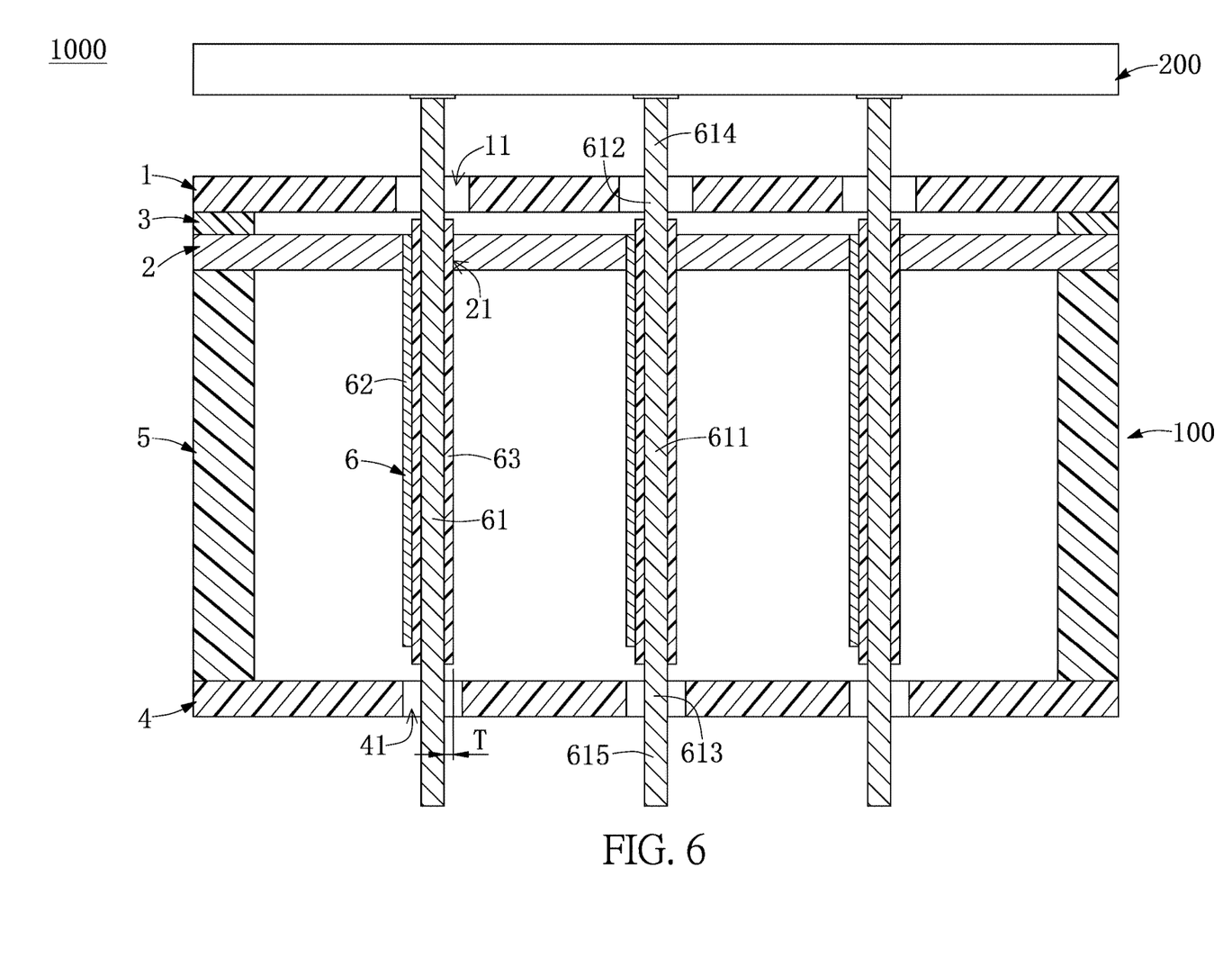
FIG. 6 is a cross-sectional view showing the probe card device when an outer electrode is disposed on only one lateral surface of the dielectric layer.
Figure 7:
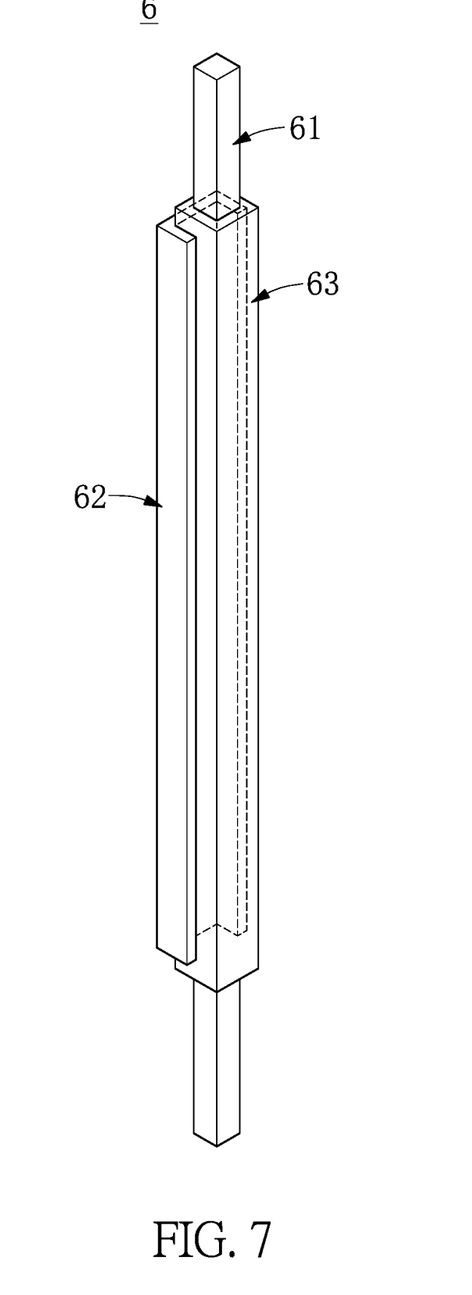
FIG. 7 is a perspective view showing the conductive probe when the outer electrode is disposed on three lateral surfaces of the dielectric layer.

Moreover, the outer electrode 62 surroundingly covers at least 80% of an outer surface of the dielectric layer 63, and two opposite end portions of the dielectric layer 63 protrude from the outer electrode 62, thereby preventing the outer electrode 62 and the metallic pin 61 from contacting with each other to result in a short circuit. Specifically, the term "surroundingly cover" in the above description can be indicated as follows: in a cross section of the conductive probe 6 having the outer electrode 62 and the dielectric layer 63, the outer electrode 62 covers the outer surface of the dielectric layer 63 entirely, but the present disclosure is not limited thereto. For example, as shown in FIG. 6 and FIG. 7, the outer electrode 62 can be disposed (or formed) on at least one lateral surface of the dielectric layer 63, and does not surroundingly cover the outer surface of the dielectric layer 63.

A part of the outer electrode 62 is arranged in the corresponding grounding hole 21, and abuts against an inner wall defining the corresponding grounding hole 21. Each of the conductive probes 6 can be fixed on the grounding sheet 2 through the cooperation of the outer electrode 62 and the corresponding grounding hole 21. In other words, the outer electrode 62 and the corresponding grounding hole 21 can be interferingly fitted or engaged with each other so as to fix the conductive probe 6 onto the grounding sheet 2.

Figure 8:
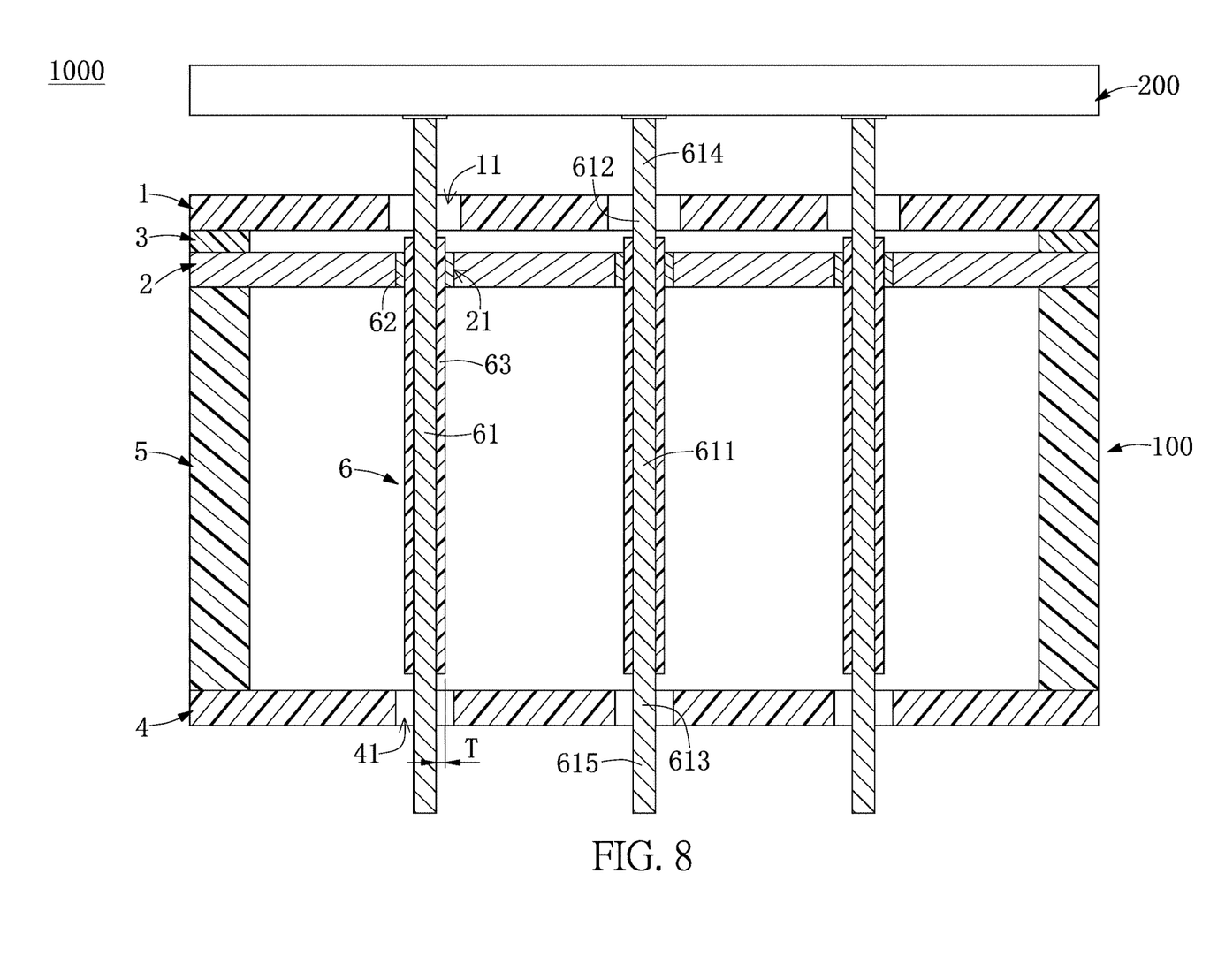
FIG. 8 is a cross-sectional view showing the probe card device when the outer electrode of each of the conductive probes is only arranged in a grounding hole.

As shown in FIG. 8, the outer electrode 62 can be entirely arranged in the corresponding grounding hole 21, and abuts against an inner wall defining the corresponding grounding hole 21. Accordingly, each of the conductive probes 6 can be fixed onto the grounding sheet 2 through the cooperation of the outer electrode 62 and the corresponding grounding hole 21. According to FIG. 1 to FIG. 8 of the present embodiment, at least part of the outer electrode 62 is arranged in the corresponding grounding hole 21, and abuts against an inner wall defining the corresponding grounding hole 21.

Figure 9:
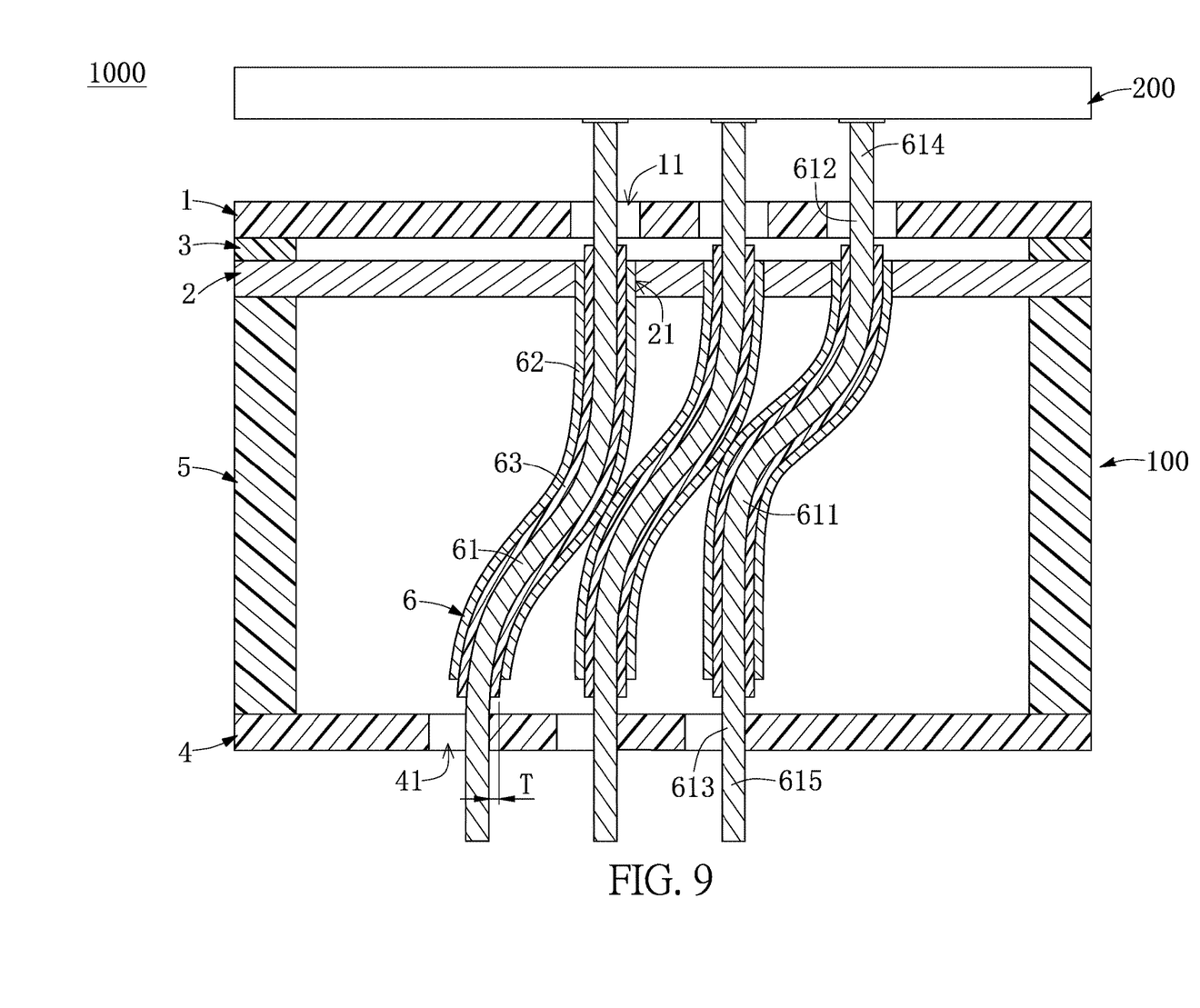
FIG. 9 is a cross-sectional view showing the probe card device when the outer electrodes of the conductive probes are in contact with each other.

In addition, as shown in FIG. 9, the outer electrode 62 can only be touched with the inner wall defining the corresponding grounding hole 21, and the conductive probe 6 is not fixed onto the grounding sheet 2. Moreover, the upper die 1, the grounding sheet 2, and the lower die 4 are in a staggered arrangement so as to fix the conductive probe 6.

In summary, since the outer electrodes 62 of the conductive probes 6 are electrically connected to each other through the grounding sheet 2, so that in any two of the conductive probes 6 adjacent to each other, portions of the two outer electrodes 62 arranged between the grounding sheet 2 and the lower die 4 are able to be in contact with each other. Accordingly, the interval of the conductive probes 6 can be effectively reduced so that the distribution density of the conductive probes 6 in the probe head 100 is further increased.

In conclusion, a signal transmission path with a capacitance effect of the conductive probe in the present disclosure is provided, so that when the conductive probe is used to test a high speed signal of the DUT, the conductive probe can be immediately coupled to a capacitor after receiving the high speed signal. Accordingly, an integrity transmission of the high speed signal of the conductive probe can be effectively maintained, and the power impedance at resonant frequency can be reduced for improving the performance of PDN.

Moreover, since the outer electrodes of the conductive probes in the present disclosure are electrically connected to each other through the grounding sheet, in any two of the conductive probes adjacent to each other, portions of the two outer electrodes arranged between the grounding sheet and the lower die are able to be in contact with each other. Accordingly, the interval of the conductive probes can be effectively reduced and the distribution density of the conductive probes in the probe head is further increased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
a grounding sheet having a plurality of grounding holes;
a lower die having a plurality of lower thru-holes respectively corresponding in position to the grounding holes, wherein the lower die is substantially parallel to the grounding sheet; and
a plurality of conductive probes respectively passing through the grounding holes of the grounding sheet and respectively passing through the lower thru-holes of the lower die, wherein each of the conductive probes includes a metallic pin, an outer electrode, and a dielectric layer that is sandwiched between the metallic pin and the outer electrode, wherein in each of the conductive probes, the metallic pin and the outer electrode are entirely separated from each other through the dielectric layer, so that the outer electrode, a part of the dielectric layer connected to the outer electrode, and a part of the metallic pin connected to the part of the dielectric layer are jointly configured to generate a capacitance effect, and wherein each of the conductive probes includes:
a middle segment, wherein a part of the middle segment is arranged in the corresponding grounding hole and is entirely covered by the dielectric layer;
a first connecting segment extending from an end of the middle segment;
a second connecting segment extending from the other end of the middle segment and arranged in the corresponding lower thru-hole;
a first contacting segment extending from the first connecting segment; and
a second contacting segment extending from the second connecting segment and arranged outside of the corresponding lower thru-hole,
wherein in each of the conductive probes, a part of the outer electrode abuts against the grounding sheet and corresponds in position to the middle segment, and the outer electrodes of the conductive probes are electrically connected to each other through the grounding sheet,
wherein, in each of the conductive probes, the dielectric layer surroundingly covers at least 80% of an outer surface of the middle segment, and the outer electrode surroundingly covers at least 80% of an outer surface of the dielectric layer, and wherein in any two of the conductive probes adjacent to each other, portions of the two outer electrodes arranged between the grounding sheet and the lower die are able to contact with each other.

2. The probe card device according to claim 1, wherein in each of the conductive probes, the part of the outer electrode is arranged in the corresponding grounding hole and abuts against an inner wall defining the corresponding grounding hole.

3. The probe card device according to claim 2, wherein each of the conductive probes is fixed onto the grounding sheet through the cooperation of the outer electrode and the grounding hole.

4. The probe card device according to claim 1, wherein in each of the conductive probes, the dielectric layer has a thickness within a range of 0.1 μm to 8 μm.

5. The probe card device according to claim 1, wherein in each of the conductive probes, each of the dielectric layer and the outer electrode is not formed on the first contacting segment and the second contacting segment.

6. The probe card device according to claim 1, further comprising:
an upper die having a plurality of upper thru-holes and spaced apart from the grounding sheet, wherein the upper die is arranged on one side of the grounding sheet away from the lower die, the upper thru-holes respectively correspond in position to the grounding holes, and the first connecting segments of the conductive probes are respectively arranged in the upper thru-holes; and
a space transformer fixed onto the first contacting segment of each of the conductive probes.

7. A probe card device, comprising:
a grounding sheet having a plurality of grounding holes;
a lower die having a plurality of lower thru-holes respectively corresponding in position to the grounding holes, wherein the lower die is substantially parallel to the grounding sheet; and
a plurality of conductive probes respectively passing through the grounding holes of the grounding sheet and respectively passing through the lower thru-holes of the lower die, wherein each of the conductive probes includes a metallic pin, an outer electrode, and a dielectric layer that is sandwiched between the metallic pin and the outer electrode, wherein in each of the conductive probes, the metallic pin and the outer electrode are entirely separated from each other through the dielectric layer, so that the outer electrode, a part of the dielectric layer connected to the outer electrode, and a part of the metallic pin connected to the part of the dielectric layer are jointly configured to generate a capacitance effect, and wherein each of the conductive probes includes:
a middle segment, wherein a part of the middle segment is arranged in the corresponding grounding hole and is entirely covered by the dielectric layer;
a first connecting segment extending from an end of the middle segment;
a second connecting segment extending from the other end of the middle segment and arranged in the corresponding lower thru-hole;
a first contacting segment extending from the first connecting segment; and
a second contacting segment extending from the second connecting segment and arranged outside of the corresponding lower thru-hole,
wherein in each of the conductive probes, all of the outer electrode abuts against the grounding sheet and corresponds in position to the middle segment, and wherein all of the outer electrode is arranged in the corresponding grounding hole and abuts against an inner wall defining the corresponding grounding hole, and the outer electrodes of the conductive probes are electrically connected to each other through the grounding sheet.

* * * * *